United States Patent [19]
Endoh et al.

[11] Patent Number: 5,081,453
[45] Date of Patent: Jan. 14, 1992

[54] DETECTING APPARATUS FOR DETECTING INPUT OPERATION IN A SWITCHING MATRIX

[75] Inventors: Norio Endoh, Suzaka; Shigeo Tanji, Kawasaki; Kazutoshi Hayashi, Kawasaki; Hideo Yamada, Kawasaki, all of Japan

[73] Assignee: Fujitsu Limited, Kawasaki, Japan

[21] Appl. No.: 405,027

[22] Filed: Sep. 11, 1989

[30] Foreign Application Priority Data

Sep. 14, 1988 [JP] Japan .................. 63-230711

[51] Int. Cl.$^5$ ............................................ H03K 17/94
[52] U.S. Cl. .................. 340/825.79; 341/22
[58] Field of Search ............... 341/22, 25, 26; 84/617, 84/655, 682; 340/825, 79

[56]  References Cited

U.S. PATENT DOCUMENTS

| | | | |
|---|---|---|---|
| 4,412,218 | 10/1983 | Niitsu ............... | 341/22 X |
| 4,502,038 | 2/1985 | Lowenthal et al. ... | 341/26 |
| 4,633,228 | 12/1986 | Larson ............... | 341/26 |
| 4,709,228 | 11/1987 | Hucking et al. ...... | 341/25 |

FOREIGN PATENT DOCUMENTS

| | | | |
|---|---|---|---|
| 0140829 | 11/1979 | Japan ............... | 341/26 |
| 60-39718 | 3/1985 | Japan . | |

Primary Examiner—Ulysses Weldon
Attorney, Agent, or Firm—Staas & Halsey

[57]  ABSTRACT

An input detecting apparatus, method in a switching matrix in which a plurality of switches are provided in the form of a matrix, which discriminates a sneak pass signal current caused by overlapping keying of up to 10 switches and is provided with a switching matrix including a driver circuit, a detecting circuit, a first group of a plurality of lines ($1_0$-$1_6$), each connected to the driver circuit (2), a second group of a plurality of lines ($3_0$-$3_6$), each connected to the detecting circuit, and a plurality of switching devices including a resistor (6) and a switching element (5) serially arranged, one end of each switching device being connected to one of the first group of lines and the other end to one of the second group of lines, the driver circuit having a decoder (11) which in turn connects one end of each oen of the plurality of lines of the first group ($1_0$-$1_6$) to an electrical source having 0 voltage, one by one, the detecting circuit having a selector (7) selectively connecting in turn one end of the plurality of lines of the second group ($3_0$-$3_6$) to a voltage detecting circuit thereof, the rest of the end of the plurality lines of the second group being connected to a decoder in which the ends of the plurality lines of the second group are in turn opened in synchronization with the operation of the selector, and a means is provided for applying a predetermined voltage higher than the detecting voltage to detect the switching operation.

12 Claims, 8 Drawing Sheets

DETECTING APPARATUS FOR DETECTING INPUT OPERATION IN A SWITCHING MATRIX

BACKGROUND OF THE INVENTION

1. Field of the Invention

This invention relates to an apparatus for detecting the input operation of a switch in a switching matrix provided with a plurality of switches such as a keyboard, especially relates to an apparatus for discriminating the existence of a sneak pass signal current caused by a overlapping keying operations in which a plurality of keyswitches on a key-board, for example, up to 10 key-switches, are depressed simultaneously. (condition in which a plurality of key-switches are simultaneously energized in a predetermined period.)

2. Description of the Related Art

Keyboards used as an input devices of computers and the like have recently had to have a high reliability and reduced production cost.

A sheet-like switch called a "membrane sheet" switch, is well known.

It generally includes a pair of insulating films on which are formed a plurality of fixed electrodes or movable electrodes and wiring for the same.

The films are arranged confronting each other so the fixed electrodes formed on the surface of the first insulating film are opposed by movable electrodes formed on the second insulating film with a suitable space therebetween.

This kind of sheet like switch is widely used in low cost keyboards.

Diodes are popularly used to prevent generation of a sneak pass signal current by overlapping keying, but it is difficult to mount circuit components such as diodes on a sheet-like material.

Therefore, a method for preventing generation of a sneak pass signal current in sheet-like switching devices has been required.

When diodes are used in the keyboard instead of resistors, the input detecting circuit gives a complete N key-rollover, but a practical keyboard of the N key-rollover system can be produced at a low cost using resistors, which are cheaper, are easier in handling than diodes, and can be formed in a film like configuration on a film.

A conventional keyboard in which resistor 6 and the switching elements 5 are arranged in a matrix form and are connected to a driver circuit and the detecting circuit can prevent the sneak pass signal current caused by overlapping keying of up to three keys, however there is a problem that it cannot prevent the sneak pass signal current caused by overlapping keying with more than three keys.

Not only can the conventional matrix switch utilizing resistors to detect the sneak pass signal current only discriminate the existence of the sneak pass signal current caused by overlapping keying of three keys or so, but the sneak pass signal voltage thus generated is affected by both the impedance R and the resistor 6.

Therefore, the difference between the impedance R and the value of the resistor 6 can not be made larger because of the value of the resistor 6 being limited by the impedance R.

Thus, the problem arises in that the resistor 6 must be set at predetermined values and an inexpensive method of printing resistors 6 can not be used.

SUMMARY OF THE INVENTION

The object of this invention is to eliminate the drawbacks mentioned above and provide a switching matrix which can discriminate existence of a sneak pass signal current caused by erroneous overlapping keying of up to 10 keys when the keys are operated at a high speed by an operator.

Figure 1:
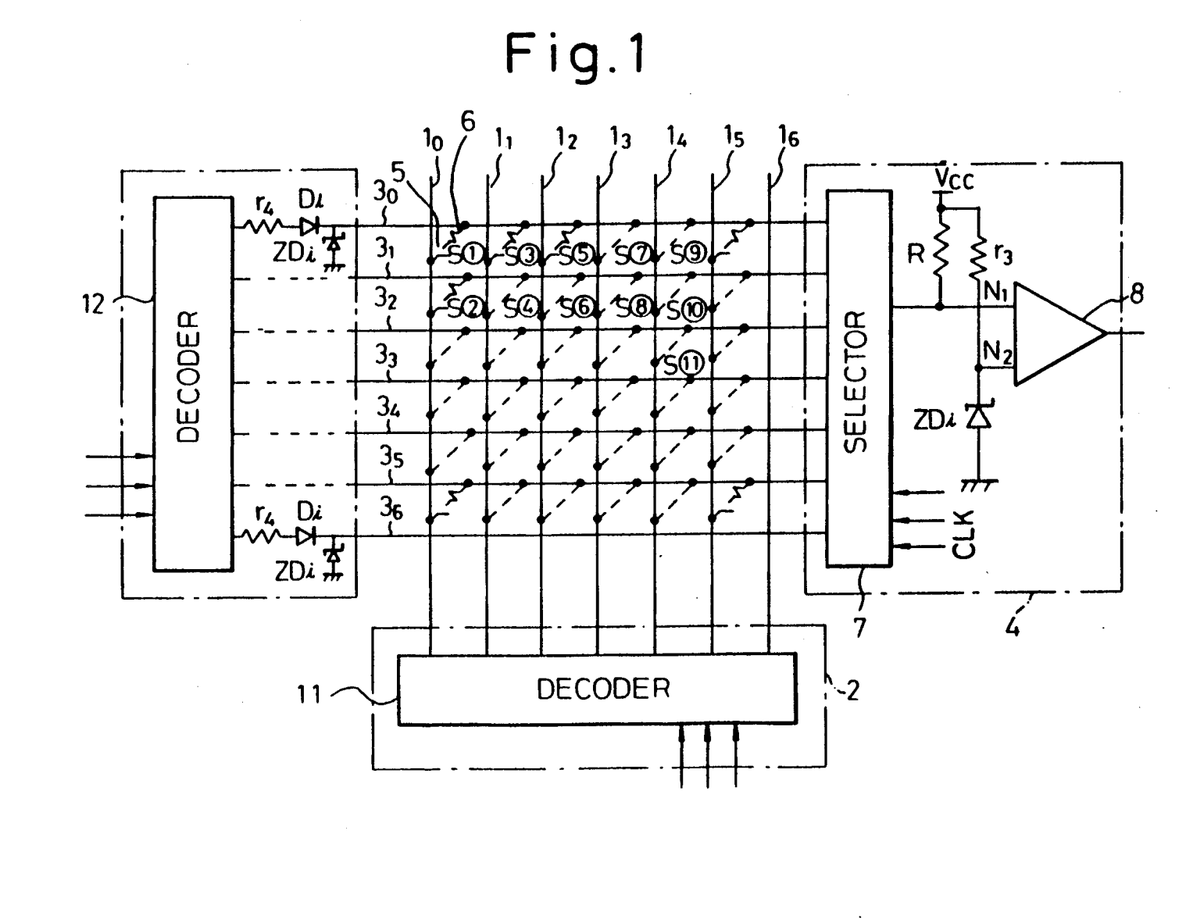
FIG. 1 is a view of one embodiment of an input detecting circuit for a keyboard according to the present invention.

To attain the object, there is provided as illustrated in FIG. 1, an apparatus for detecting an input operation in a switching matrix including a driver circuit, a detecting circuit, a first group of a plurality of lines, each connected to the driver circuit, a second group of a plurality of lines, each connected to the detecting circuit and a plurality of switching devices, S including a resistor 6 and a switching element 5, serially arranged, one end of each switching device S being connected to one of the first group of lines and the other end to one of the second group of lines, the driver circuit having a decoder 11 which connects in turn one end of each of the plurality of lines of the first group to an electrical source having 0 voltage, the detecting circuit having a selector 7 which selectively connects in turn one end of each of the plurality of lines of the second group to a voltage detecting circuit, the rest of the ends of the plurality of lines of the second group being connected to a decoder in which the end of the plurality of lines of the second group are opened in turn in synchronization with the operation of the selector, and a means is provided for applying a predetermined voltage higher than the detecting reference voltage to detect the switching operation.

According to the detecting method of this invention, when no sneak pass signal current (no overlapped keying) occurs, the detected voltage is zero volt (0 V), while when the sneak pass signal current occurs, the detected voltage caused thereby, always exceeds the detecting reference voltage, i.e., is always a plus voltage with respect to the detecting reference voltage.

Therefore, in this invention, the mistaken detection in which a switch is discriminated as keyed even when not, can be prevented and it is made easy to detect the sneak pass signal voltage generated by keying the desired switch and other switches simultaneously.

Further, the impedance of this detection circuit does not affect detection of the sneak pass signal voltage, so can be set much larger than the resistance of the resistor of the switching devices.

Thus so long as the variations of the values of the resistor 6 connected to the switching devices, in the same switching matrix is suppressed, there is no problem even if the values of the resistors in a differing switching matrix differ and the resistor elements can be formed by a printing method.

DESCRIPTION OF THE PREFERRED EMBODIMENTS

Before describing the preferred embodiment, a brief mention will be made of the principles of the prior art.

Figure 2:
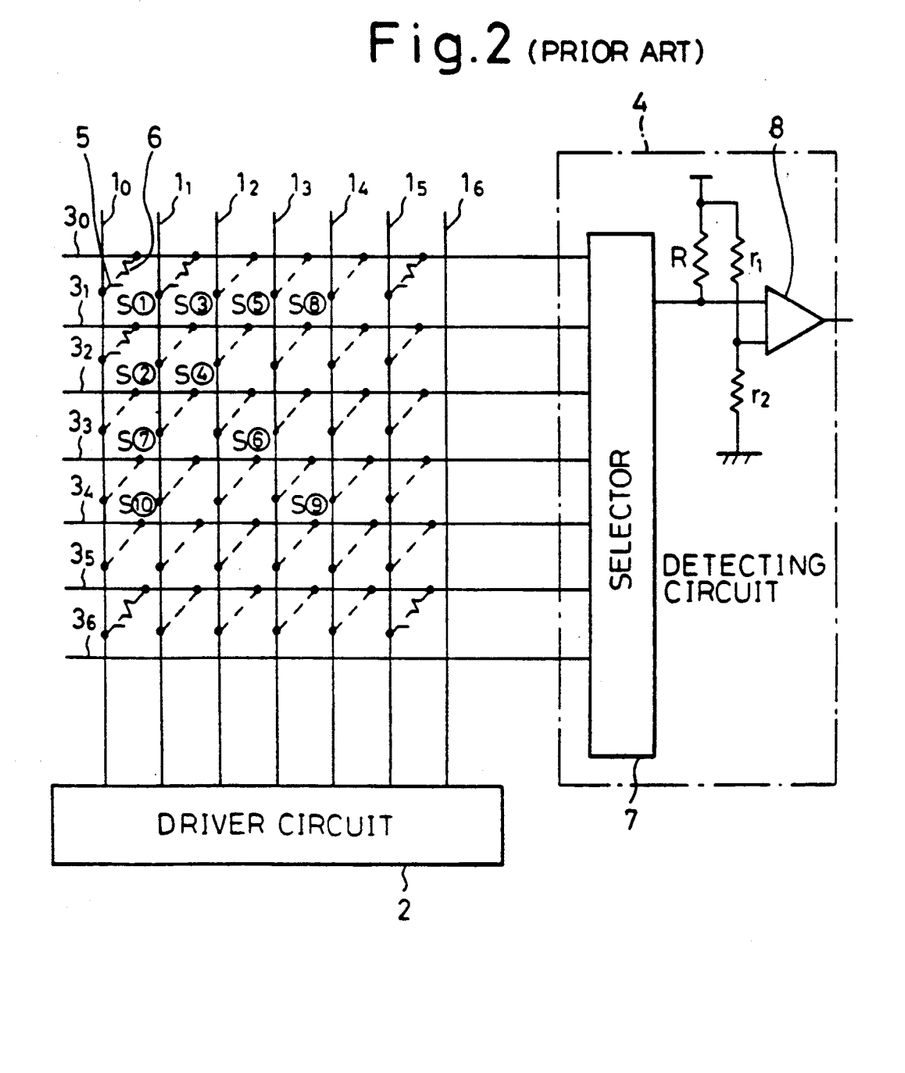
FIG. 2 is a view of the basic construction of a conventional keyboard input detecting circuit.

FIG. 2 is a schematic view of the basic construction of a conventional keyboard input detecting circuit. Each of X lines $1_0$–$1_6$, constituting a first group of a plurality of lines (in FIG. 2, seven lines are shown for example), is connected to a driver circuit 2. Each line of Y lines $3_0$–$3_6$ constituting a second group of a plurality of lines (in FIG. 2, seven lines are shown, for example), is connected to a detecting circuit 4.

One end of each of a plurality of switching elements 5 is connected to one of the lines of X lines $1_0$–$1_6$ and the other end to one of the lines of Y lines $3_0$–$3_6$ through a resistor 6 (in FIG. 2, 49 switching elements and resistors are shown, for example).

The detecting circuit 4 is provided with a selector 7 which connects each line of Y lines $3_0$–$3_6$ in turn to a voltage detector. The voltage detector includes a comparator 8, an impedance R for applying a suitable electrical source voltage (for example 5 V) to one input terminal of the comparator, and resistors $r_1$ and $r_2$ for applying a detecting reference voltage (for example, 2.5 V) to the other terminal.

Thus, the sneak pass signal current caused by overlapping keying with several keys can be prevented by utilizing a keyboard having the resistor elements shown in FIG. 2.

In FIG. 2, when the detecting electrical source voltage to be applied to the comparator 8 is set at 5 V, the detecting reference voltage for detecting the ON condition of the switching element 5 is set at 2.5 V and the impedance R is set at 10 kΩ, the preferable resistance value of the serially arranged switching element 5 and the resistor 6 is 7 KΩ.

In this keyboard, when any one of the switches S including the switching element 5 and the resistor 6 is keyed voluntarily, for example, when the switch S provided in a position indicated as ①  is keyed to connect the line $1_0$ with the line $3_0$, the detected voltage $V_1$ is 2 V as shown in the following equation.

$$V_1 = 5 \cdot r/(R+r) = 2 \text{ V}$$

Therefore, the ON condition of the switch S can be detected because the detected voltage is lower than the detecting reference voltage 2.5 V.

When the three switches S indicated as ②, ③, and ④ in FIG. 2, are simultaneously keyed, the sneak pass signal voltage $V_3$, detected as if the switch S indicated as ① were keyed, is 3.4 V, as shown in the following equation.

$$V_3 = 3 \cdot r \cdot 5/(R + 3 \cdot r) = 3.4 \text{ V}$$

Therefore, the generation of the sneak pass signal current can be detected because the detected voltage is higher than the detecting reference voltage 2.5 V.

When the six switches S indicated as ② to ⑦ in FIG. 2, are simultaneously keyed, which condition is considered to be the worst, the sneak pass signal voltage $V_6$ detected assuming the switch S indicated as ① is keyed is 2.56 V, as shown in the following equation.

$$V_6 = 5 \cdot 1.5 \cdot r/(R + 1.5 \cdot r) = 2.56 \text{ V}$$

The generation of the sneak pass signal current cannot be detected, because the detected voltage is very close to the detecting reference voltage 2.5 V.

Further, when the nine switches S indicated as ② to ⑩ in FIG. 2, are simultaneously keyed, the sneak pass signal voltage $V_9$ detected assuming the switch S indicated as ① is keyed, is nearly 2 V ($V_9 = 2$ V), the same voltage as when only one switch S in ON.

The input detecting apparatus of a switching matrix of the present invention will now be explained with reference to the attached drawings.

FIG. 1 is a schematic view of one embodiment of the input detecting apparatus of a switching matrix of the present invention.

In FIG. 1, a plurality of switching devices S, each of which includes a resistor 6 and switching element 5, connected serially, are prepared (in this embodiment, 49 switching devices are prepared).

One end of each of switching device S is connected to one of a first group of lines $1_0$–$1_6$ (X lines). The other end thereof is connected to one of a second group of lines $3_0$–$3_6$ (Y lines).

One end of each of the first group of lines $1_0$–$1_6$ is connected to a decoder circuit 11 of a driver circuit 2 (open collecter output).

One end of each of the second group of lines $3_0$–$3_6$ is connected to the decoder 12 and the other end to the selector 7 of the detecting circuit 4 (data selector having an analog switching system).

The decoder 12 serves to open one line selected from the second group of lines $3_0$–$3_6$ and to apply a predetermined constant voltage to the rest of lines.

The constant voltage as explained above is preferably set at 3 V for example.

A resistor $r_4$ for preventing over current and a diode Di and zener diode ZDi for providing a constant voltage are provided between the decoder 12 and one end of each of the second group of lines $3_0$–$3_6$.

The other end of each of the second group of lines $3_0$–$3_6$ is connected to the selector 7. The selector 7 successively selects one of the lines of the second group and connects to the comparator, which is a voltage detecting circuit for the switching operation.

The decoder 12 and the selector 7 perform a scanning operation on the lines $3_0$–$3_6$ in synchronization with a clock pulse signal. Therefore, the line selected from the second group of lines $3_0$–$3_6$ by the decoder 12, for example, the line $3_0$, is selected simultaneously by the selector 7 and connected to the comparator 8.

On the other hand, a suitable voltage is applied to an input terminal $N_1$ of the comparator 8 from the voltage source Vcc (for example, 5 V) through the impedance R. The voltage of the line belonging to the second group selected by the selector 7 is also applied to the terminal $N_1$.

The resistor $r_3$ and the zener diode $ZD_i$ for defining the detecting reference voltage, for example 2.5–3.0 V, are connected to the other input terminal $N_2$.

In the embodiment, the reference voltage is set at 2.6 V.

One end of each of the first group of lines $1_0$–$1_6$ is connected to the decoder 11 provided in the driver circuit 2. The decoder 11 performs the scanning operation in synchronization with the scanning operation of the decoder 12 and the selector 7 as mentioned above and serves to set the voltage of the line selected from first group of lines $1_0$–$1_6$ at 0 V and leave the rest of the lines open.

When the line $3_0$ of the second group of lines is selected by the decoder 12 and the selector 7 and the line $1_0$ of the first group of lines is selected by the decoder 11, the voltage of the line $3_0$ of the second group of lines is held at 5 V, while the voltage of the rest of the lines $3_1$–$3_6$ belonging to the second group, is held at 3 V.

On the other hand, when the line $1_0$ of the first group is selected by the decoder, the voltage of the line $1_0$ is set at 0 V and the rest of the lines $1_1$–$1_6$ are opened.

In such a situation, when the switch S ① is depressed, the line $3_0$ and the line $1_0$ are connected, the voltage of the line $3_0$ which is maintained at Vcc (5 V) drops to nearly 0 V, and voltage of nearly 0 V is applied to the input terminal $N_1$ of the comparator 8.

Strictly speaking, the voltage of the input terminal $N_1$ does not completely fall to 0 V because of the existence of the internal resistance of the line $3_0$ and the resistance r of the resistor 6 in the switching device S, but when the resistance r of the resistor 6 is set at a value smaller than that of the impedance R, for example, one tenth of the value of R, the input voltage to the input terminal $N_1$ can be considered to be 0 V.

This is based upon the face that the values of the impedance R and the resistance r of the resistor 6 can be varied independently in the present invention as explained later.

Figure 3A:
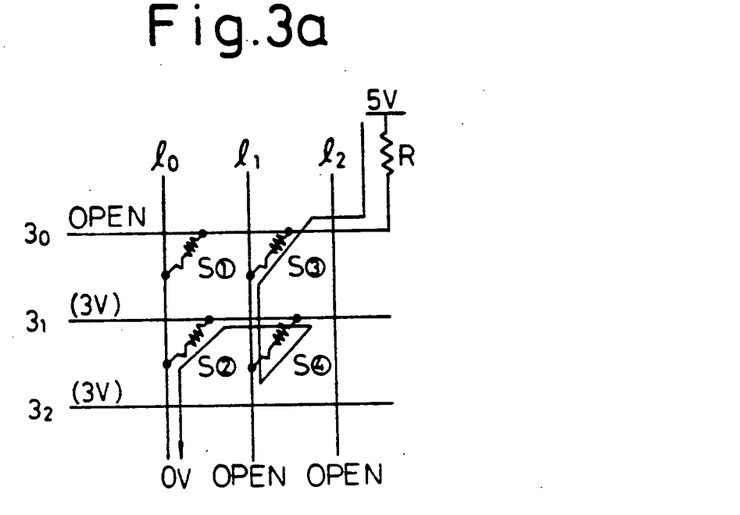
FIG. 3(a) is a schematic view of one example of the flow of current in a circuit when a sneak pass signal current is generated and FIG. 3(b) is an equivalent circuit of FIG. 3(a)
Figure 3B:
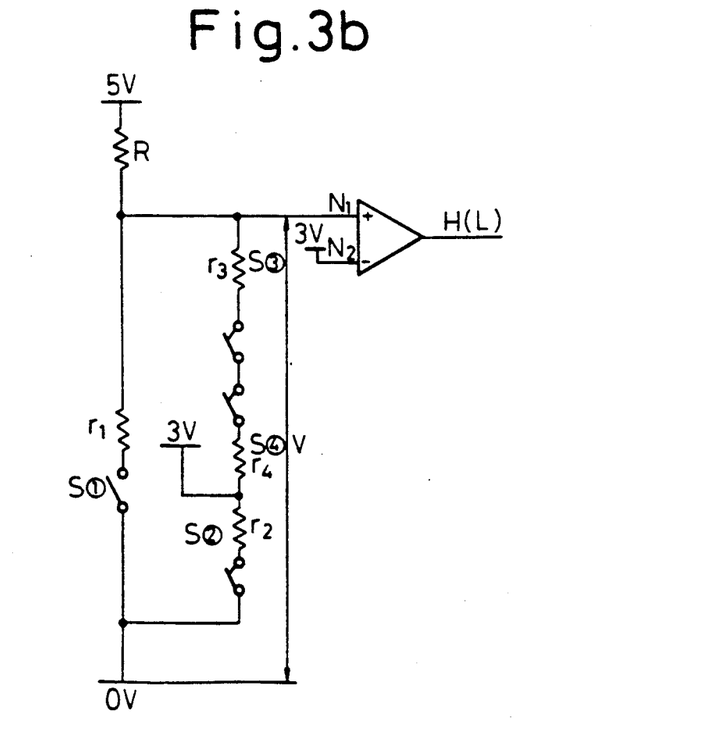

Accordingly, in an input detecting device having such a construction, when only one switch, for example, the switch S ①, is keyed, the detected voltage of the line in the second group to which the switching device is connected, is shown as 0 V. The above fact can be detected because that voltage 0 V is lower than the detecting reference voltage of 3.0 V On the other hand, when the switch S ① is not keyed but the other switching devices S ②–S ④ are erroneously keyed simultaneously, the input voltage to the input terminal $N_1$ of the comparator 8 appears at least higher than 3 V because, as shown in the equivalent circuit in FIG. 3(b), the voltage of the node between the resistor $r_4$ of the switching device S ④ and the resistor $r_2$ of the switching device S ② is held at 3 V. Therefore, the generation of the sneak pass signal current can be detected.

Thus it is possible to prevent the error of the switching device S ① being assumed to be keyed by the generation of the sneak pass signal voltage caused by the switching devices S ②–S ④ being erroneously keyed instead of the switching device S ①.

However, when the desired switching device and a plurality of the other switching devices are simultaneously keyed, the sneak pass signal voltage is generated through the line belonging to the second group to which the other switching device is connected, thus increasing the detected voltage.

Therefore, the problem arises in that the operation of the desired switching device cannot be detected.

The sneak pass signal voltage in the above situation, will be explained hereunder.

In FIG. 1, when the seven switching devices S ②–S ⑧ are erroneously keyed simultaneously with the desired switching device S ①, the sneak pass signal voltage $V_8$, represented by the following equation, is detected as about 1.9 V.

$$V_8 = 3\ V \times \frac{r}{2/3 \cdot r + r}$$

This voltage $V_8$ of 1.9 V is smaller than the detecting reference voltage of 3.0 V to be discriminated.

Therefore, the operation in which the switch S ① is keyed can be correctly detected.

When the worst condition occurs in Which the desired switching device S ① and 9 other switching devices S are simultaneously keyed, for example, the switching device S ① and the switching devices S ③–S ⑪, i.e. total 10 switches, are overlappingly closed, the sneak pass signal voltage $V_{10}$, represented by the following equation is detected as about 2.05 V.

$$V_{10} = 3\ V \times \frac{r}{6/13 \cdot r + r}$$

This voltage $V_{10}$ of 2.05 V is smaller than the detecting reference voltage of 3.0 V to be discriminated. Therefore, the operation in which the switch S ① is keyed can be correctly detected.

Figure 4:
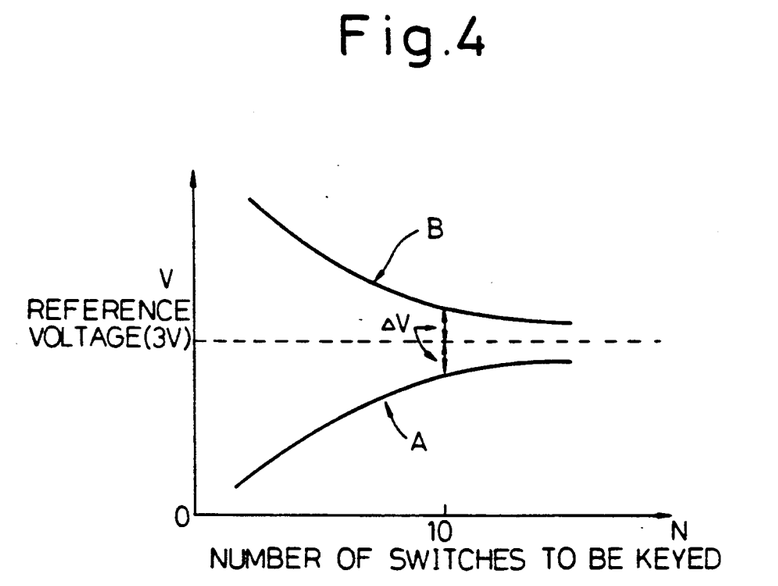
FIG. 4 is a graph of the relationship between the number of switches N keyed and the detected voltage V.

From the results obtained by the embodiments above, the graph as shown in FIG. 4 is obtained.

The FIG. 4 shows the relationship between the number N of the switches S keyed simultaneously, i.e., closed simultaneously, and the variation of the detected voltage generated by the sneak pass signal current. In FIG. 4, curve A shows the relationship when the desired switching device is keyed simultaneously with other switching devices, while curve B shows the relationship when the desired switching device is not keyed simultaneously with other switching devices.

Curve A indicates that when the desired switch, for example, S ①, is keyed along with a large number of the surrounding switches S ②–S ⑪, the detected voltage will be increased and there is a danger than the switching device S ① will be discriminated as not keyed. (As explained above, when only one switch, for example, switch S ①, is keyed, the detected voltage is 0 V.)

On the other hand, curve B indicates that when the desired switch, for example, S ① is not keyed but a large number of the surrounding switches S ②–S ⑪ are simultaneously keyed, the detected voltage will decrease and there will be a danger of the switch S ① being discriminated as keyed.

Note that, as shown in FIG. 4, along with the increment of the number of the switches N, the closer the curve B to the line of the detecting reference voltage of 3 V of the voltage detector, the more difficult the discrimination of the difference between the detected voltage and the reference voltage.

Therefore, when the switching matrix is designed, it is necessary to keep the voltage difference $\Delta v$ between the value of the curve A or B and the detecting reference voltage, i.e., 3 V, at more than the minimum value by which the comparator can discriminate the situation, when certain numbers of switches are simultaneously keyed.

Generally, it is considered that the worst condition is one in which a maximum 10 switches are simultaneously keyed.

It is preferable that the matrix switch be designed to keep the voltage difference Δv at as high a level as possible in the worst condition.

Next problem is how the value of the voltage difference voltage Δv should be determined.

It is apparent that there is no problem when the number of the switches keyed simultaneously is small and the difference thereof Δv is sufficiently large, but a problem arises when the number of switches simultaneously keyed is increased and the difference thereof Δv is narrowed.

If it desired to guarantee a difference Δv sufficient to discriminate voltage when a maximum 10 switches are simultaneously keyed, a very severe conditions must be cleared.

Problems occur due not only to the variation of the values of the resistor per se, for example, of the initial value or depending upon elapsed time, but also to the pattern of the switches keyed (which switches are keyed).

The inventors considered the conditions enabling the above guarantee and engaged in many experiments.

They obtained the following conception of the selecting resistors for a matrix switch comprising a sheet-like membrane.

Assume that the switching matrix is formed on a sheet like membrane and that a 100 resistors 6 are formed on one membrane sheet. Assume further that the values of the resistors are distributed normally and the mean value $\bar{x}$ and $3\sigma$ thereof are known.

Figure 5:
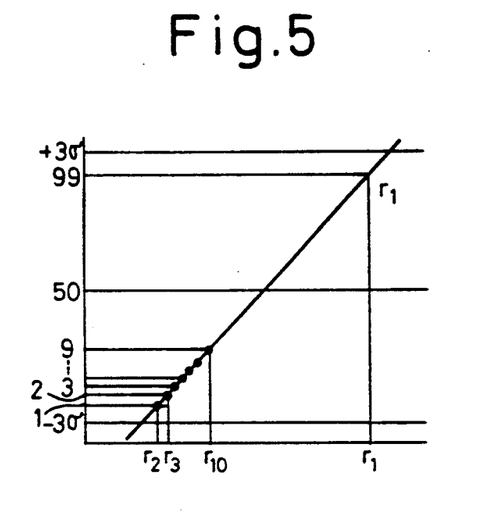
FIG. 5 is a graph of the distribution of resistance values of resistors.

The worst case, with reference to FIG. 5, is the case in which the resistor having the largest value $r_1$, i.e., having the highest value nearest to $+3\sigma$, is selected as the desired switch and the nine resistors with the resistances $r_2-r_{10}$ are selected in turn as the other nine switches from the smallest resistance.

The switching matrix should be designated to guarantee key-roll over in this situation.

Figure 7:
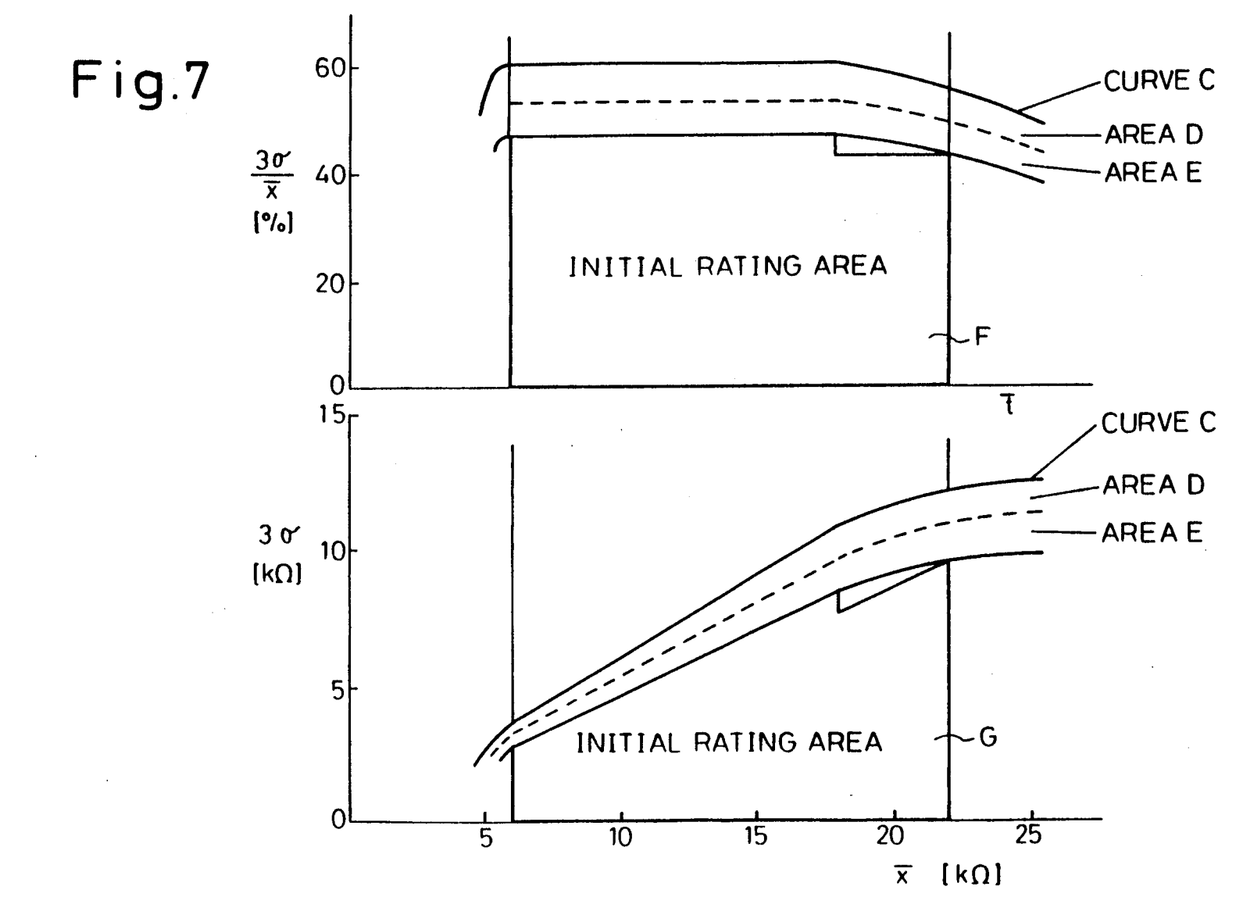
FIG. 7 gives graphs of the preferable area for selecting the value of the resistors as a rated value.

Based on these considerations, the inventors obtained the graphs for selecting the value of the resistors as shown in FIG. 7. When selecting the initial ratings of the resistors, it is preferable to select them from the area of the initial rating resistance F and G as shown in FIG. 7.

The curve C shown in FIG. 7, indicates the limit of the allowable value of the resistance. The area D indicates the margin based on the elapsed time. The area E indicates another margin.

In this invention, when setting the resistance value, all of the values of the resistors are measured, then the resistors are selected according to which satisfy the following conditions A and B simultaneously:

condition A:

$$6 \leq \bar{x} \leq 18$$

$$3\sigma \leq \bar{x} \times 0.47$$

and $$18 < \bar{x} \leq 22$$

$$3\sigma \leq \bar{x} \times 0.43$$

wherein $\bar{x}$ denotes an average resistance value of resistors condition B:

The detected voltage $V_H$ and $V_L$ of the worst combinations on the sheet are calculated and a check made on whether they fall within the following detection limits: for example:

$$V_H \geq 2.80 \text{ V}$$

$$V_L \leq 2.70 \text{ V}$$

Figure 6:
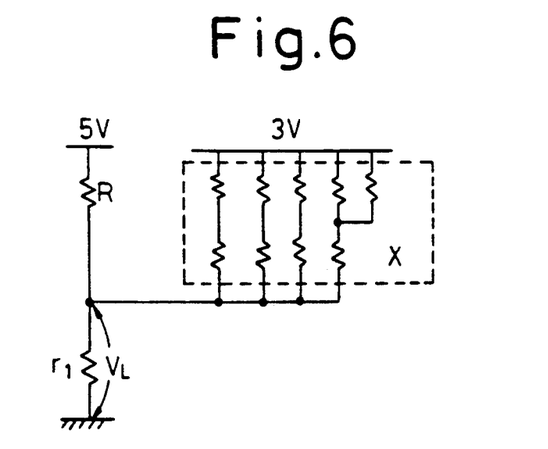
FIG. 6 is an equivalent circuit for calculating the detected voltage when the sneak pass signal current is generated.

$V_H$ and $V_L$ are obtained by the following manner:

With respect to the condition of the circuit, when the desired switch S is keyed, i.e., is ON, one finds the resistance values giving the smallest combined resistance of the portion X shown in FIG. 6, i.e., an equivalent circuit of the combined resistance comprising nine resistors to find the detected voltage $V_L$.

When the desired switch is not keyed, i.e., is OFF, the detected voltage $V_H$ is obtained by calculating the combined resistance thereof assuming that all of the resistors 6 provided on the switching matrix have the resistance value $r_2$, i.e., the lowest value, to make the calculating operation easy.

As explained above, when considering the variation of the resistance values, it is necessary to consider the initial variations caused by the production process and the environmental characteristics such as the variations due to elapsed time. When testing the products, it is preferable to use as rating the value obtained by subtracting the environmental characteristics and a safety margin α from the limit of the allowable resistance value as shown by the curve C in FIG. 7.

This is illustrated by the area F and G of the initial rating surrounded by a solid line in FIG. 7.

In this invention, as explained above, the impedance has almost no effect on the detecting operation of the sneak pass signal voltage.

Accordingly, the value r of the resistors 6 in the matrix switch can be set much smaller than the impedance R. For example, when the value of the impedance R is set at 500 kΩ, the value r can be set at less than one tenth of the impedance R, for example, set within the range of about 10–30 kΩ, as long as the variation of the values of the resistors provided in the same switching matrix is suppressed to less than about 20%.

Generally, it is easy to suppress the variation of resistance values to less than 20% when resistors are produced in the same printing process, so when this invention is applied to a sheet-like matrix switch, i.e., membrane switch, the resistors 6 having a value r can be formed on an insulating film on which fixed electrodes of switches have already been formed.

Figure 8:
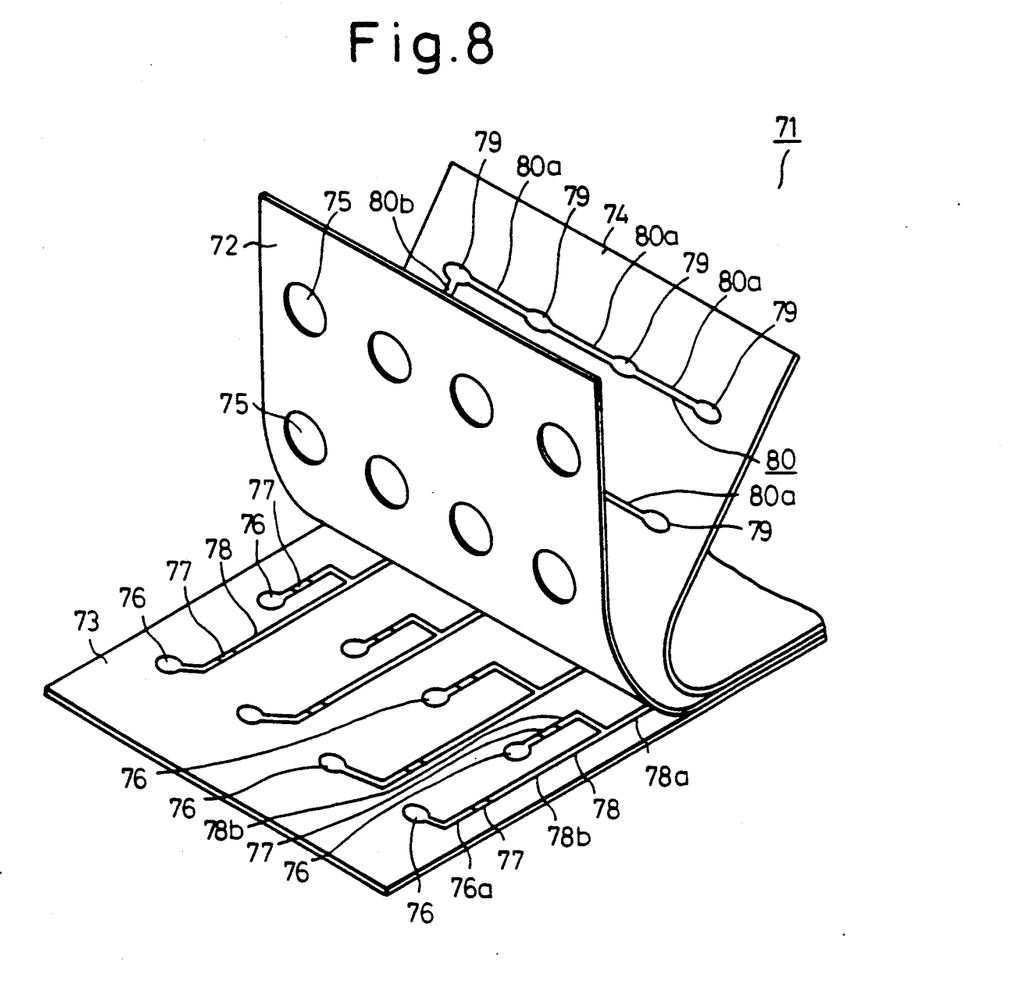
FIG. 8 is a perspective view of one embodiment of the switching matrix of the present invention formed on a sheet like material.

FIG. 8 shows an embodiment of the switching matrix of the present invention formed on a sheet-like material.

In FIG. 8, the sheet-like switching matrix 71 includes a film-like insulating spacer 72 having a plurality of through holes 75 and a pair of flexible insulating films 73 and 74 sandwiching the spacer 72 in the same.

The spacer 72 and the insulating films 73 and 74 are made of polyester film, for example.

One of the insulating films 73, is provided by pattern forming, on the surface thereof contacting the spacer 72, with at least a plurality of second electrodes 76 facing the holes 75, resistors 77, one end of each of which is connected to a lead portion of the electrodes 76, and lines 78 connected to the other ends of the resistors 77.

The group of lines 78 corresponding to the second group of lines $3_0$-$3_6$, includes a main line 78a and a diverged line 78b which connects another group of resistors 77 arranged in the Y direction to the same main line 78a.

Another insulating film 74 is provided by pattern formation, on the surface thereof contacting the spacer 72, with at least a plurality of first electrodes 79 facing the apertures 75 and second electrodes 76 and lines 80 corresponding to the first group of lines $1_0$-$1_6$ and connected to the first electrodes 79.

The group of lines 80 corresponding to the first group of lines $1_0$-$1_6$, includes a line 80a serially connecting a plurality of electrodes 79 and a line 80b which connects the plurality of the electrodes 79 to an external element.

The electrodes 76 and 79 and the lines 78 and 80 are formed in a dual layered configuration consisting of a first conductive layer made of silver or the like and a second layer formed on the first layer having a low resistance value for preventing a migration or in a one layered configuration consisting only of a layer having a low resistance value.

The sheet like switching matrix 71 shown in FIG. 8, has a part of the insulating film 73 and the spacer 72 and insulating film 74 pealed from each other. In the switching matrix 71, when the upper surface of the insulating film 74 on which an electrodes 79 are formed is pushed down by a key or the like, the electrode 79 is connected to the opposite electrode 76 formed on the insulating film 73 by deformation of the insulating film 74. After the downward force is removed, the contact between the electrodes 76 and 79 is eliminated by the spring back force of the insulating film 79.

Another embodiment of the present invention will be explained hereunder with reference to FIG. 9.

In the embodiment described above, the switching matrix was provided with one zener diode ZDi for each line of the second group of lines $3_0$-$3_6$ to provide a constant voltage thereto.

Further, the zener diodes are used for the portion for providing the reference voltage to the comparator 8.

Figure 9:
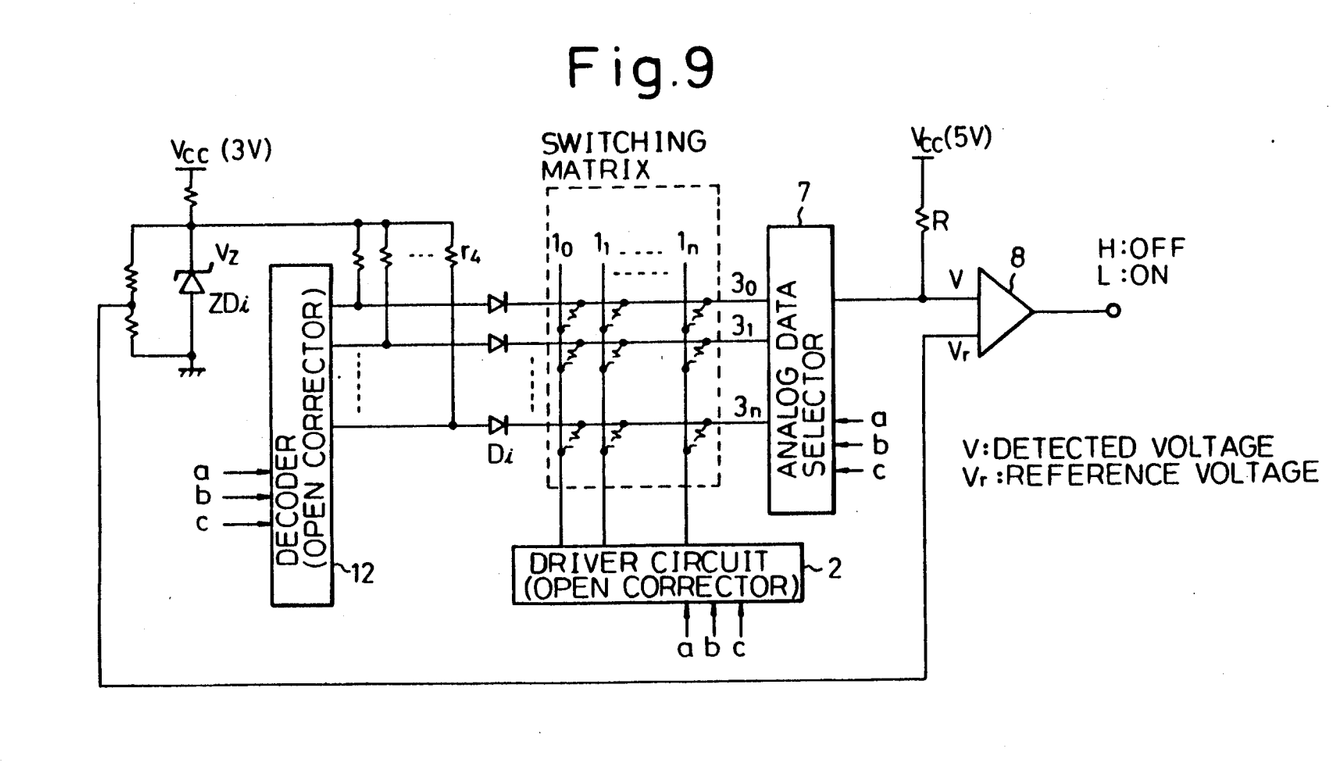
FIG. 9 is a diagram of another embodiment of a keyboard for an input detecting circuit of the present invention.

In this embodiment, only one zener diode ZDi is provided as shown in FIG. 9. The zener diode is commonly used both to provide a constant voltage to each of the lines $3_0$-$3_6$ and to set the reference voltage of the comparator.

When the switching matrix is constructed as explained above, the circuit is simplified and the adverse effects caused by variations in zener diodes can be eliminated.

The detected voltage is always around 0 V when there is no sneak pass signal current, while the detected voltage is always a plus voltage with respect to the reference voltage.

Therefore, erroneous detection in which the key not keyed, is assumed to be keyed due to the generation of the sneak pass signal current can be prevented.

In addition, when the desired switch is keyed simultaneously with several another switches, for example, even when the desired switch is keyed simultaneously with another nine switches, the 10 key roll-over can be realized in which the desired switch can be detected.

According to the present invention, since the rating value r of each resistor provided in the switching elements can be set at less than one tenth more preferably one twentieth of the impedance of the detecting circuit, preferably less than one-twentieth, greater freedom may be obtained in setting the resistance value r with respect to the impedance as long as the variation thereof in the same switching matrix is less than 20% or so.

Therefore, it becomes easy for the resistors to be produced utilizing the printing method.

We claim:

1. An apparatus for detecting an input operation in a switching matrix connectable to an electrical source, comprising:
   a driver circuit including a first decoder;
   a detecting circuit including a selector and a voltage detecting circuit operatively connected to said selector;
   a first plurality of lines each operatively connected to said driver circuit;
   a second plurality of lines, a first end of each of said second lines operatively connected to said selector;
   a plurality of switching devices, each comprising a resistor and a switching element, serially arranged, one end of each of said switching devices operatively connected to a corresponding one of said first lines and an other end of each of said switching devices being operatively connected to a corresponding one of said second lines;
   said first decoder operatively connecting one end of each of said first lines to the electrical source having zero voltage,
   a second decoder operatively connected to the second end of each of said second lines which is opened by said second decoder in synchronization with the operation of said selector; and
   means for applying a predetermined voltage to one of said second lines higher than a references voltage to detect a switching operation of one of said switching devices.

2. An apparatus according to claim 1, wherein said voltage detecting circuit includes:
   means for receiving a high voltage from said selector and the reference voltage and for comparing the predetermined voltage to the reference voltage.

3. An apparatus according to claim 1, wherein the switching matrix comprises at least two sheets like materials which are stacked on each other.

4. An apparatus according to claim 2, wherein the switching matrix comprises at least two sheets like materials which are stacked on each other.

5. An apparatus for detecting an input operation in a switching matrix connectable to an electrical source, comprising:
   a driver circuit including a first decoder;
   a detecting circuit including a selector and a voltage detecting circuit operatively connected to said selector;
   a first plurality of lines each operatively connected to said driver circuit;
   a second plurality of lines, a first end of each of said second lines operatively connected to said selector;
   a plurality of switching devices, each comprising a resistor and a switching element, serially arranged, one end of each of said switching devices operatively connected to a corresponding one of said first lines and an other end of each of said switching devices being operatively connected to a corresponding one of said second lines;
   said first decoder operatively connecting one end of each of said first lines to the electrical source, said selector operatively connecting a first end of each of said second lines to said voltage detecting circuit;

a second decoder operatively connected to the second end of each of said second lines which is opened by said second decoder in synchronization with the operation of said selector; and means for applying a predetermined voltage to said second lines higher than a reference voltage to detect a switching operation of one of said switching devices, said means includes:

at least a zener diode connected to apply the predetermined voltage to each of the second end of said second lines.

6. An apparatus according to claim 5, further comprising:

a zener diode operatively connected to each one of said second lines to supply the predetermined voltage to said second lines.

7. An apparatus according to claim 5, wherein the switching matrix comprises at least two sheets like materials which are stacked on each other.

8. An apparatus according to claim 6, wherein the switching matrix comprises at least two sheets like materials which are stacked on each other.

9. An apparatus for detecting an input operation in a switching matrix connectable to an electrical source, comprising:

a driver circuit including a first decoder;

a detecting circuit including as elector and a voltage detecting circuit operatively connected to said selector;

a first plurality of lines each operatively connected to said driver circuit;

a second plurality of lines, a first end of each of said second lines operatively connected to said selector;

a plurality of switching devices, each comprising a resistor and a switching element, serially arranged, one end of each of said switching devices operatively connected to a corresponding one of said first lines and an other end of each of said switching devices being operatively connected to a corresponding one of said second lines;

said first decoder operatively connecting one end of each of said first lines to the electrical source, said selector operatively connecting first end of each of said second lines to said voltage detecting circuit;

a second decoder operatively connected to the second end of each of said second lines which is opened by said second decoder in synchronization with the operation of said selector; and means for applying a predetermined voltage to said second lines higher than a reference voltage to detect a switching operation of one of said switching devices, said means includes:

a zener diode operatively connected to each one of said second lines.

10. An apparatus according to claim 9, wherein the switching matrix comprises at least two sheets like materials which are stacked on each other.

11. An apparatus for detecting an input operation in a switching matrix connectable to an electrical source, comprising:

a driver circuit including a first decoder;

a detecting circuit including a selector and a voltage detecting circuit operatively connected to said selector and which includes:

means for receiving a high voltage and a reference voltage;

a first plurality of lines each operatively connected to said driver circuit;

a second plurality of lines, a first end of each of said second lines operatively connected to said selector;

a plurality of switching devices, each comprising a resistor and a switching element, serially arranged, one end of each of said switching devices operatively connected to a corresponding one of said first lines and an other end of each of said switching devices being operatively connected to a corresponding one of said second lines;

said first decoder operatively connecting one end of each of said first lines to the electrical source, said selector operatively connecting first end of each of said second lines to said voltage detecting circuit;

a second decoder operatively connected to the second end of each of said second lines which is opened by said second decoder in synchronization with the operation of said selector; and means for applying a predetermined voltage to said second lines higher than a reference voltage to detect a switching operation of one of said switching devices, said means includes:

a zener diode operatively connected to each one of said second lines.

12. An apparatus according to claim 11, wherein the switching matrix comprises at least two sheets like materials which are stacked on each other.

* * * * *